United States Patent [19]

Hwang et al.

[11] Patent Number: 4,763,180

[45] Date of Patent: Aug. 9, 1988

[54] METHOD AND STRUCTURE FOR A HIGH DENSITY VMOS DYNAMIC RAM ARRAY

[75] Inventors: Wei Hwang, Armonk; Stanley E. Schuster, Granite Sprints; Lewis M. Terman, South Salem, all of N.Y.

[73] Assignee: International Business Machines Corporation, Armonk, N.Y.

[21] Appl. No.: 945,275

[22] Filed: Dec. 22, 1986

[51] Int. Cl.[4] ...................... H01L 27/04; G11C 11/40
[52] U.S. Cl. .................. 357/23.6; 357/23.4; 357/55; 365/149; 437/52; 437/60
[58] Field of Search ...................... 357/23.6, 55, 23.4; 365/149; 437/52, 60

[56] References Cited

U.S. PATENT DOCUMENTS

| | | | |
|---|---|---|---|
| 4,156,289 | 5/1979 | Hoffmann et al. | 365/182 |
| 4,222,063 | 9/1980 | Rodgers | 357/45 |
| 4,225,879 | 9/1980 | Vinson | 357/55 |
| 4,326,332 | 5/1982 | Kenney | 357/55 |
| 4,353,086 | 10/1982 | Jaccodine et al. | 357/55 |
| 4,364,074 | 12/1982 | Garnache et al. | 357/55 |
| 4,369,564 | 1/1983 | Hiltpold | 29/571 |
| 4,455,740 | 6/1984 | Iwai | 357/55 |
| 4,651,184 | 3/1987 | Malhi | 357/41 |
| 4,672,410 | 6/1987 | Miura et al. | 357/55 |

FOREIGN PATENT DOCUMENTS 55-11365  1/1980  Japan .................. 357/23.6

Primary Examiner—William D. Larkins
Attorney, Agent, or Firm—John J. Goodwin

[57] ABSTRACT

A vertical DRAM cell using VMOS transistors and trench capacitors and the fabrication process therefor. A vertical DRAM structure comprising a VMOS transistor and trench capacitor in combination is provided wherein the access transistors are in a V-groove and the capacitors are in two vertical layers. The structure has only a single level of polysilicon and has no contacts. The memory cell circuit is a one-device memory cell, having a single access transistor with its gate connected to a word line, its drain connected to a bit line, and its source connected to a storage capacitor. More particularly, the storage capacitance node is connected to the source of the V-groove access device through a conducting bridge. The gate of the V-groove access device is connected to the polysilicon word line and the drain is a diffused region which also serves as the bit line of the cell. An epitaxial layer is grown over a combination of single crystalline material and oxide. Polycrystalline regions in the silicon substrate have an oxide covering. In an alternate version, a single crystal epitaxial layer is disposed over regions consisting of both single crystal and poly crystal Si or polycrystalline material on top of single crystalline material is converted into single crystalline material.

4 Claims, 5 Drawing Sheets

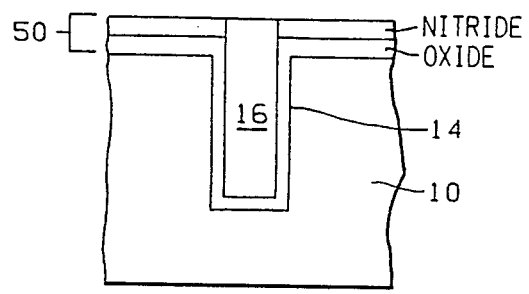
FIG. 12
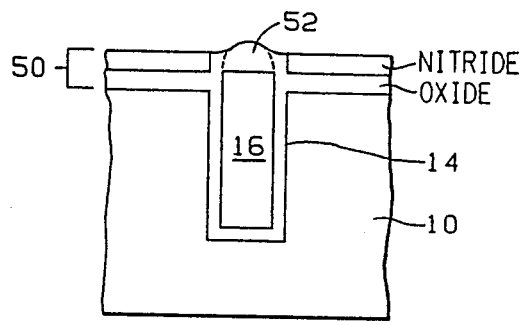
FIG. 13
FIG. 14
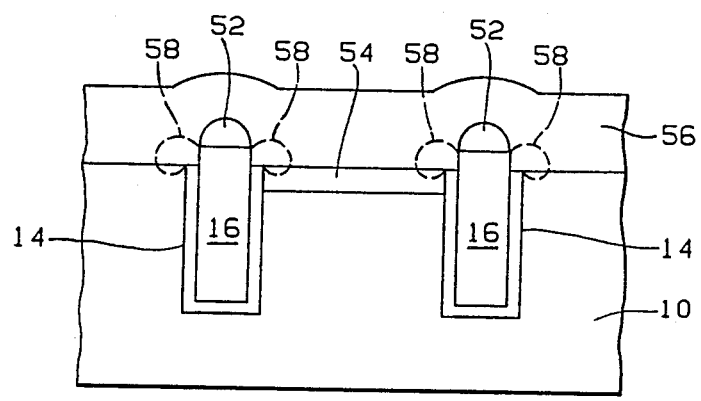

METHOD AND STRUCTURE FOR A HIGH DENSITY VMOS DYNAMIC RAM ARRAY

BACKGROUND OF THE INVENTION

1. Field of the Invention

The present invention relates to dynamic random access semiconductor memory storage cells and, more particularly, to vertically configured MOS memory cell devices including trench capacitors.

2. Description of the Prior Art

The present invention is a distinct and novel arrangement of a VMOS FET in combination with a trench capacitor in two vertical layers to provide a memory cell.

Another configuration of VMOS devices and trench capacitors are known in the prior art.

In U.S. Pat. No. 4,156,289, issued May 22, 1979 to Hoffmann et al., entitled SEMICONDUCTOR MEMORY, a semiconductor memory is disclosed which has at least one VMOS transistor which includes a trench and a storage capacitor. A semiconductor substrate is doped with concentration centers of a first conductivity type and has a buried layer which is doped with concentration centers of a second conductivity type opposite to the first conductivity type. At least two additional layers are divided by the trench and have alternately differing conductivity types, the two additional layers and the buried layer being produced by diffusion and/or implantation.

U.S. Pat. No. 4,225,879, issued Sept. 30, 1980 to Vinson entitled V-MOS FIELD EFFECT TRANSISTOR FOR A DYNAMIC MEMORY CELL HAVING IMPROVED CAPACITANCE, relates to a V-MOS field effect transistor which is provided with enhanced source capacitance to provide a single transistor dynamic memory cell. The formation of the source area is achieved by masking the silicon substrate, opening an aperture in the mask and then etching the silicon substrate in such a manner as to undercut the mask so that the mask provides a shield to subsequent ion implanting of the source area. Both P and N type dopants are separately implanted with different energy levels so as to form an enhanced PN junction capacitance for the device.

U.S. Pat. No. 4,222,063, issued Sept. 9, 1980 to Rodgers entitled VMOS FLOATING GATE MEMORY WITH BREAKDOWN VOLTAGE LOWERING REGION, describes a semiconductor electrically programmable read only memory device which utilizes an array of memory cells each in the form of a single V-type MOSFET which achieves the normal AND function (Data-Word Address) using a capacitance coupled version of threshold logic. Each MOSFET is formed by a V-shaped recess at the intersection of each bit line and word line that extends across the diffused bit line, (which serves as the transistor drain) and into the substrate (which serves as the source and ground plane of the device).

U.S. Pat. No. 4,364,074, issued Dec. 14, 1982 to Garnache et al entitled V-MOS DEVICE WITH SELF-ALIGNED MULTIPLE ELECTRODES, teaches that high density VMOSFET devices, particularly single transistor memory cells, are provided by use of a series of simplified self-aligning process steps. Gate electrodes, source/drain regions and source/drain contacts are provided with the aid of an initial mask-less photoresist removal process in which a relatively thick layer of self-leveling photoresist is uniformly removed in order to define portions of a gate electrode within the recess of a V-groove. The gate electrode subsequently acts as a self-aligned mask to define implanted source/drain regions also within the V-groove and to enable second level interconnecting metallurgy contacts to be formed along the sidewalls of the V-groove.

U.S. Pat. No. 4,326,332, issued Apr. 27, 1982 to Kenney entitled METHOD OF MAKING A HIGH DENSITY V-MOS MEMORY ARRAY, describes a method for providing high density dynamic memory cells which provides self-alignment of both V-MOSFET device elements and their interconnections through the use of a device-defining masking layer having a plurality of parallel thick and thin regions. Holes are etched in portions of the thin regions with the use of an etch mask defining a plurality of parallel regions aligned perpendicular to the regions in the masking layer. V-MOSFET devices having self-aligned gate electrodes are formed in the holes and device interconnecting lines are formed under the remaining portions of the thin regions. A combination of anisotropic etching and directionally dependent etching, such as reactive ion etching, is used to extend the depth of V-grooves.

In U.S. Pat. No. 4,369,564, issued Jan. 25, 1983 to Hiltpold entitled VMOS MEMORY CELL AND METHOD FOR MAKING SAME, a semiconductor memory device is provided comprised of an integrated array of cells formed on a substrate in conjunction with parallel spaced-apart bit lines and conductive word lines that are perpendicular to the bit lines. A plurality of V-shaped recesses are located between and extend perpendicular to adjacent parallel bit lines. Two cells share each recess and each cell includes a VMOS transistor formed by one end portion of the recess and an isolated buried source region located under the adjacent bit line. A channel stop region is located between and isolates the VMOS transistors and their respective buried source regions at opposite ends of each recess.

In U.S. Pat. No. 4,455,740, issued June 26, 1984 to Iwai entitled METHOD OF MANUFACTURING A SELF-ALIGNED U-MOS SEMICONDUCTOR DEVICE, a method of manufacturing a MOS semiconductor device is disclosed which comprises a step of forming a groove in a predetermined portion of a semiconductor substrate, a step of forming a gate insulation film to cover the entire surface of the substrate inclusive of the groove, a step of depositing a gate electrode material to a thickness greater than one half the width of the opening of the groove to thereby fill the groove with the gate electrode material, and a step of forming a gate electrode within the groove by etching away the gate electrode material until the gate insulation film other than that within the groove is exposed.

U.S. Pat. No. 4,353,086, issued Oct. 5, 1982 to Jaccodine et al entitled SILICON INTEGRATED CIRCUITS, describes a dynamic random access memory in which individual cells, including an access transistor and a storage capacitor, are formed in mesas formed on a silicon chip. The access transistor of the cell is formed on the top surface of the mesa and one plate of the storage capacitor of the cell is formed by the sidewall of the mesa and the other plate by doped polycrystalline silicon which fills the grooves surrounding the mesas isolated therefrom by a silicon dioxide layer. By this geometry, large storage surfaces, and thus large capacitances, can be obtained for the capacitor without using surface area of the chip. In other embodiments, the mesas may include other forms of circuit elements.

Japanese Patent kokai No. 55-11365(A), issued Jan. 26, 1980 entitled SEMICONDUCTOR MEMORY, describes a technique for increasing a capacity section in a capacitor without increasing the size of cell surface, by providing in a semiconductor substrate a recess contacting with a source and drain range and a source range through the medium of insulating film.

Other vertical DRAM structures are available, but do not have the advantage of the present invention of a device array requiring only a single level of polysilicon and having no contacts.

SUMMARY OF THE INVENTION

An object of the present invention is to provide a vertical DRAM cell using VMOS transistors and trench capacitors and the fabrication process therefor wherein the array needs only a single level of polysilicon and has no contacts.

Another object of the present invention is to provide a vertical DRAM structure comprising a VMOS transistor and trench capacitor in combination wherein the access transistors are in a V-groove and one electrode of the capacitor is in the trench and the other electrode is the substrate.

The foregoing and other objects, features and advantages of the invention will be apparent from the following more particular description of the invention as illustrated in the accompanying drawings.

BRIEF DESCRIPTION OF THE DRAWINGS

FIGS. 12, 13 and 14 illustrate process steps for the fabrication of an alternative embodiment of the present invention.

DESCRIPTION OF THE EMBODIMENTS

Figure 1:
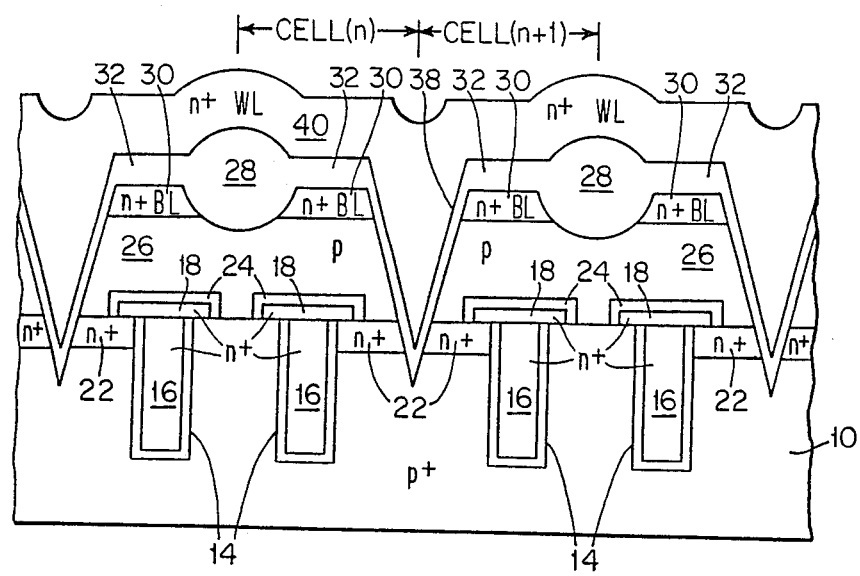
FIG. 1 is a schematic illustration of a cross section view of an embodiment of VMOS FET memory cells according to the principles of the present invention.

Referring to FIG. 1, a vertical DRAM cell using VMOS transistors and trench capacitors is shown requiring only a single level of polysilicon and no contacts. The memory cell circuit is that of the conventional one-device memory cell, having a single access transistor with its gate connected to a word line, its drain connected to a bit line, and its source connected to a storage capacitor. For the purposes of example, an array with n-type devices is shown.

In the embodiment of FIG. 1, the storage capacitance node 16 is connected to the source 22 of the V-groove access device through a conducting bridge 18. The gate of the V-groove access device is connected to polysilicon word line 40 and the drain is diffused region 30 which also serves as the bit line of the cell. The substrate region 26 of the V-groove device is an epitaxially grown layer. The single crystal epitaxial layer 26 is grown over a combination of single crystalline material and oxide. Polycrystalline regions in the silicon substrate 10 have an oxide covering. In an alternate version, it is assumed that it is possible to grow a single crystal epitaxial layer over regions consisting of both single crystal and poly crystal Si or that it is possible to convert polycrystalline material on top of single crystalline material into single crystalline material.

The structure uses the two sides of a V-groove to form the access device for two separate cells. The V-groove divides the upper n+ region 30 into two drain regions, one for each access device and also divides the lower n+ region 22 into two source regions which are connected to their respective capacitor nodes 16. The channels for the two access devices are along the sides of the V-groove. This results in high density memory cells since the bit line is stacked above the trench storage capacitor and the cell transistor is vertically oriented. The cell has a diffused bit line and polysilicon or polycide word line. Contacts and metal would only be needed if the word line had to be stitched.

The process steps for the fabrication of the device shown in FIG. 1, according to the present invention, will be described relative to FIGS. 2 through 8.

Figure 2:
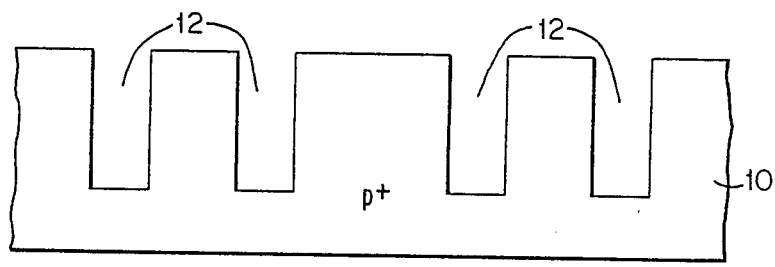
FIGS. 2 through 8 illustrate various steps in the fabrication process of the device structure shown in FIG. 1.
Figure 3:
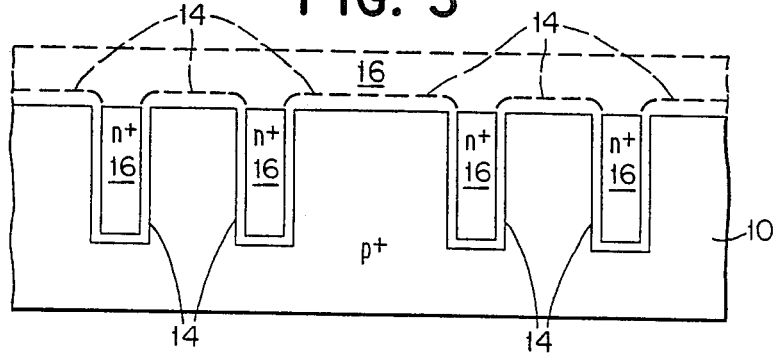

In Step 1, a semiconductor substrate 10, for example p+ silicon, is masked and etched by conventional techniques to form trenches 12 as shown in FIG. 2. Referring to FIG. 3, storage capacitor oxide insulation layer 14 is grown on the surfaces of the substrate and the trenches. The trenches are filled with n+ polysilicon 16 and the structure is planarized to remove the oxide 14 and excess polysilicon from the surface of substrate 10 by conventional techniques. The removed material is shown in dashed lines in FIG. 3.

Figure 4:
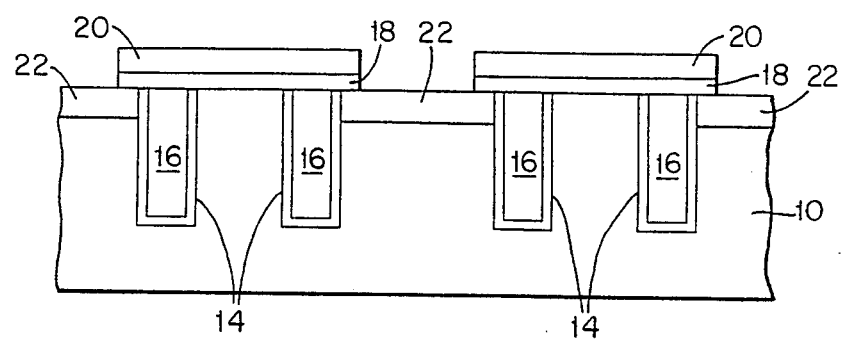

Then a thin layer of polysilicon 18 is formed on the surface of substrate 10. Oxide layer 20 is grown or deposited over the polysilicon layer 18 and, using a second mask and conventional etching technique, the polysilicon 18 and oxide 20 is patterned as shown in FIG. 4. An n+ diffusion 22 is formed in substrate 10 between nonadjacent trenches, also as shown in FIG. 4. The overlap between regions 18 and 22 results in a conductive connection between them.

Figure 5:
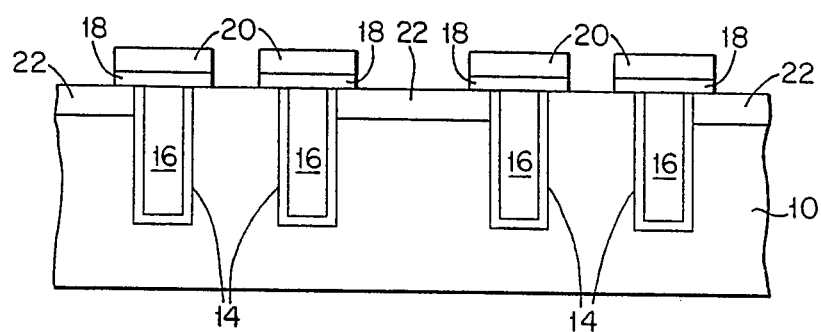

Using a third mask and etch process, the polysilicon 18 and oxide between adjacent trenches are removed to give the structure as shown in FIG. 5.

Figure 6:
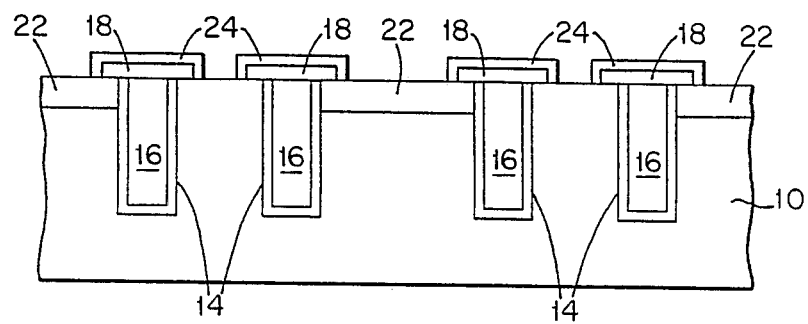

Then a layer of oxide is grown or conformally deposited over the top of the structure, and anistropically reactive ion etched in the vertical direction only, as is well known in the art, so that oxide 24 covers the polysilicon and the single crystal silicon substrate 10 surface is exposed as shown in FIG. 6. The step of etching the oxide in FIG. 6 is one of the key process steps. The etching is directional, such as accomplished by RIE, to remove material in the vertical direction only. The purpose of this step is to remove the oxide over the single crystal silicon while keeping a layer 24 of SiO$_2$ on the polycrystalline silicon 18. This is possible because of the thick SiO$_2$ layer 24 on top of the polysilicon 18 and the fact that oxide 24 on the sidewalls of polysilicon 18 will remain on the polysilicon 18 after the RIE removal of the oxide over the single crystal silicon substrate surface. Subsequently, seeding of single crystal epi growth over the SiO$_2$ areas from the exposed single crystal areas of the substrate occurs, resulting in a single crystal epi layer.

Figure 7:
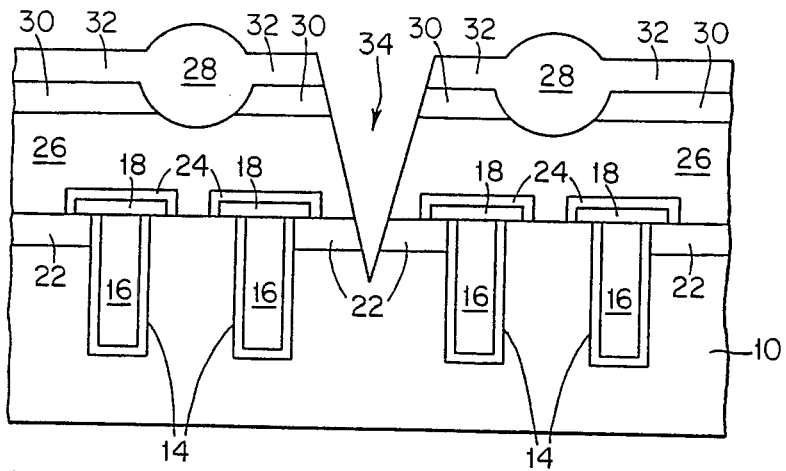

FIG. 7 illustrates the results of a number of subsequent steps including growing the layer 26 of single crystal epi as described above, defining and growing recessed oxide regions 28 by conventional processes using a fourth mask, forming n+ regions 30, a further layer 32 produced by oxidation, and opening a V-groove 34 using a fifth mask and conventional V-groove etching.

It should be noted that in FIG. 7, after the recessed oxide regions are formed and before the n+ diffusions are created, normal surface FETs can be fabricated at this point by standard techniques and the use of an additional mask.

The V-groove 34 in FIG. 7 is used to form two access devices oriented along the surfaces of the V-groove and to divide the n+ region 22 connecting the non-adjacent trenches and the upper n+ layer 30 such that two separate storage capacitors (the regions 22 and 16 on each side of the V-groove 34) and two separate bit lines (the regions 30 on each side of the V-groove 34) are created.

Figure 8:
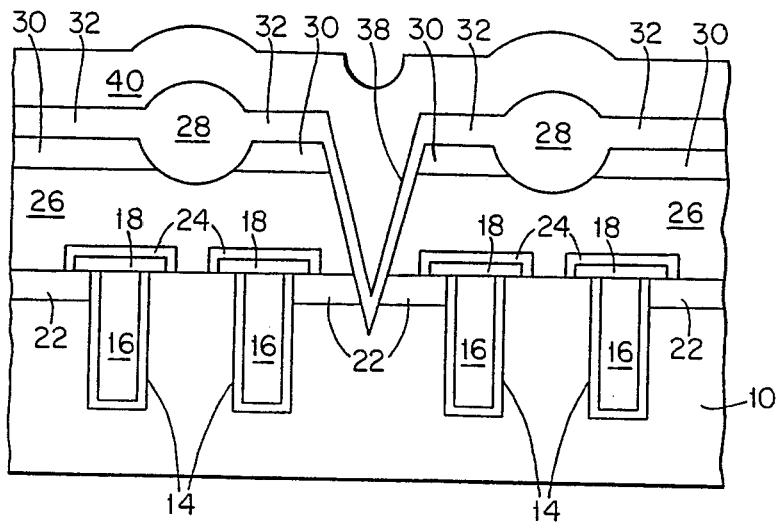

In FIG. 8, the results of the step of growing an oxide layer 38 for the gate oxide is illustrated as well as the deposition and patterning of polysilicon layer 40 which forms the device word line. The polysilicon can optionally have a polycide layer for improved conduction. Contacts and metal would only be needed for the cell array if the word line had to be stitched, and they would be formed using conventional techniques. After the word line has been patterned, a p+ implant can be used to provide isolation between the cells along the V-groove or oxide or trench isolation can be provided.

A high density memory results since the bit line is stacked above the trench storage capacitor and the cell transistor is vertically oriented. The cell has a diffused bit line and polysilicon or polycide word line.

Figure 9:
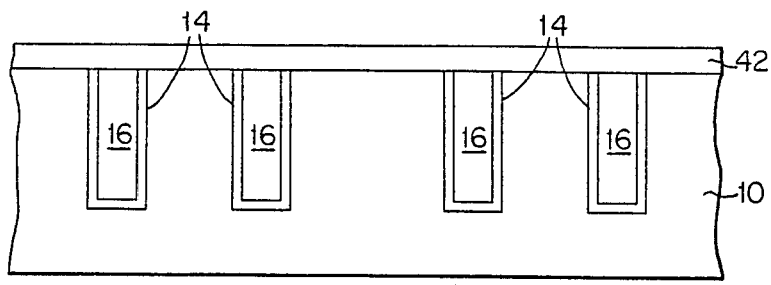
FIGS. 9, 10 and 11 illustrate alternative process steps for fabricating the device of FIG. 1.
Figure 10:
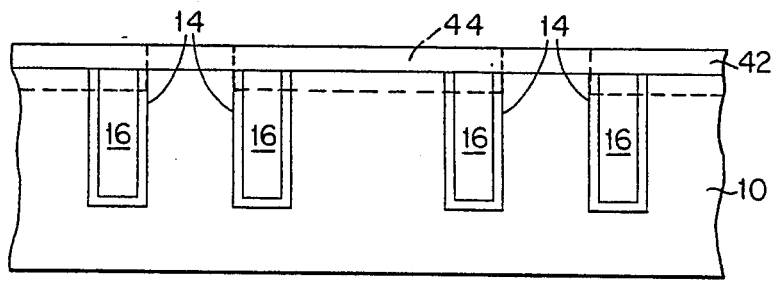
Figure 11:
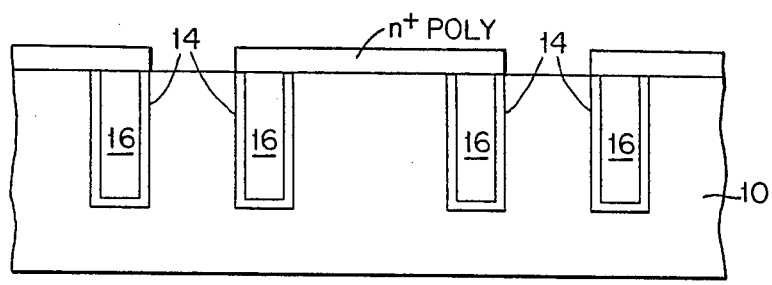

The overlay tolerance of the polysilicon "bridge" 18 to the n+ polysilicon 16 which is used to fill the trench directly impacts the density of the cell. In a variation of the process, a layer of polycrystalline silicon 42, such as shown in FIG. 9, is provided after the steps of FIG. 3. The layer 42 is converted to single crystalline material by a process such as rapid thermal annealing. A mask then can be used to form the n+ doped region (region 22 in FIG. 7). The extent of the implant area as a result of the implant is shown by the dashed lines in FIG. 10. The same process as described from FIG. 7 onward can be used to complete the fabrication. Likewise, if an epitaxial layer of single crystalline silicon can be grown over regions of both polycrystalline and single crystalline silicon, then the area from the overlay tolerance of the polysilicon "bridge" is no longer needed and a denser cell is possible. The structure after poly patterning and before single crystal epi growth is shown in FIG. 11.

A vertical DRAM cell and a fabrication process therefor using VMOS transistors and a trench storage capacitor has been described and illustrated. This relatively simple cell structure offers the potential for extremely high density. The array has only a single level of polysilicon and has no contacts.

An embodiment wherein the n+ poly used to fill the trench is covered by a layer of SiO$_2$ was described. The exposed single crystal regions allow seeding of single crystal epi growth over the SiO$_2$ areas from the exposed single crystal areas of the substrate. Other embodiments of the device were also described which require that polycrystalline silicon be converted to single crystalline material by some process such as rapid thermal annealing or that an epitaxial layer of single crystalline silicon be grown over regions of both polycrystalline and single crystalline silicon.

Still another fabrication method for the referenced cell where epi is grown over single crystal silicon, a layer of SiO$_2$ and a very small region of polycrystalline silicon will be described hereinbelow. It should be possible to grow single crystal epi since the area of the exposed polycrystalline silicon is very small compared to the area of the single crystalline substrate material.

A simplified process sequence needed to achieve this structure is shown in FIG. 12.

In a p+ semiconductor substrate 10, the trench is etched using a nitride/oxide first masking layer 50. The storage oxide 14 is grown and the trench is filled with the n+ polysilicon 16. Referring to FIG. 13, SiO$_2$ 52 is grown over the trench polysilicon 16 and, as shown in FIG. 14, the nitride/oxide layer 50 is then removed, an n+ arsenic diffusion region 54 is created by conventional patterning and masking and a p− epitaxial layer 56 is grown over the entire wafer as shown in FIG. 14. Out diffusion 58 from the n+ polysilicon 16 and the n+ region 54 forms a conducting bridge between polysilicon region 16 and diffused region 54.

The process then is continued as described and shown after the epitaxial layer growth with reference to FIG. 7 onward.

An important step in the process shown in FIGS. 12, 13 and 14, is the self-aligned SiO$_2$ layer on top of the n+ polysilicon 16 that fills the trench. When the nitride/oxide layer that is used to define the trench is removed, a very narrow polysilicon strip is exposed. During the p-epitaxial layer 56 growth and subsequent heat cycles out-diffusion from the n+ polysilicon and n+ diffusion would be used to "bridge" the storage oxide gap (the resistance of this "bridge" can be as high as 20KΩ or more) as illustrated as element 58 (FIG. 14).

The fact that there is only a relatively small region of exposed polysilicon during the epitaxial layer 56 growth is key to achieving single crystalline material. As can be seen, the single crystalline silicon substrate needed for seeding the epitaxial layer 56 is by far the larger area. The narrow region of exposed polysilicon needed to form a connection with the n+ diffusion 54 is very small.

These area estimates assume the polysilicon 16 filling the trench is above the surrounding silicon so that there is exposed polysilicon on all four sides of the trench when the oxide/nitride layer is removed. In an alternate processing sequence, the top of the polysilicon is below the surrounding silicon after a very thick self-aligned oxide 52 is grown on top of the trench. The single crystal silicon is then etched back only on the side of the trench where bridging is needed. Region 54 is created by diffusion or implantation, and the bridge 58 is created only on one side by out-diffusion from polysilicon 16. This would reduce the area of exposed polysilicon and contain the out-diffusion to a single side of the trench.

Having thus described our invention, what we claim as new and desire to secure by Letters Patent is:

1. A semiconductor memory storage cell comprising a semiconductor substrate,
   at least two laterally spaced vertical trenches disposed in said substrate, said trenches being filled with doped polysilicon material,
   conductive material disposed between each of said laterally spaced trenches to form a conductive path between said doped polysilicon material in each of said trenches,
   a layer of epitaxial material disposed over said substrate covering at least said conductive material between said trenches,
   a doped layer region on the surface of said epitaxial layer, a V-shaped groove disposed in said epitaxial layer between said trenches said V-shaped groove extending through said doped layer region on the surface of said epitaxial layer, through said epitaxial layer, and through said conductive material between said trenches, and a layer of insulating material disposed on the sides of said V-shaped groove and over said doped surface of said epitaxial material, wherein said insulator coated V-shaped groove provides a gate oxide which separates said conductive material between said trenches and said polysilicon filled trenches into separate storage capacitor means, and further separates said doped layer region on said epitaxial layer surface into separate bit lines.

2. A semiconductor memory storage cell according to claim 1 wherein said conductive material disposed between each of said laterally spaced trenches includes a conductive region disposed in said semiconductor substrate surface between said trenches, and a discrete layer of oxide covered conductive polysilicon material disposed over each of said trenches and extending past the sides of said trenches onto the surface of said semiconductor substrate and in contact with said diffusion region.

3. A semiconductor memory storage cell according to claim 1 wherein said conductive path disposed between each of said laterally spaced trenches includes a layer of single crystal silicon formed on said substrate over said laterally spaced trenches and the substrate surface between said trenches.

4. A semiconductor memory storage cell according to claim 1 wherein said substrate and said epitaxial layer is composed of single crystal silicon.

* * * * *